United States Patent
Jiang et al.

(10) Patent No.: US 9,656,856 B2
(45) Date of Patent: May 23, 2017

(54) METHOD OF LOWER PROFILE MEMS PACKAGE WITH STRESS ISOLATIONS

(71) Applicant: Apple Inc., Cupertino, CA (US)

(72) Inventors: Tongbi Jiang, Santa Clara, CA (US); Jie-Hua Zhao, Cupertino, CA (US); Peter G. Hartwell, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/226,824

(22) Filed: Aug. 2, 2016

(65) Prior Publication Data
US 2016/0340175 A1    Nov. 24, 2016

Related U.S. Application Data

(62) Division of application No. 14/568,845, filed on Dec. 12, 2014, now Pat. No. 9,446,941.

(51) Int. Cl.
| | |
|---|---|
| *H01L 27/14* | (2006.01) |
| *B81B 7/00* | (2006.01) |
| *B81C 3/00* | (2006.01) |

(52) U.S. Cl.
CPC ........... *B81B 7/0048* (2013.01); *B81C 3/001* (2013.01); *B81B 2207/012* (2013.01); *B81B 2207/07* (2013.01); *B81B 2207/99* (2013.01); *B81C 2203/035* (2013.01); *B81C 2203/07* (2013.01)

(58) Field of Classification Search
CPC .................. B81B 7/0048; B81B 2207/012
USPC ........................................................ 257/414
See application file for complete search history.

(56) References Cited

U.S. PATENT DOCUMENTS

| | | |
|---|---|---|
| 8,592,241 B2 | 11/2013 | Hayes et al. |
| 2006/0001116 A1 | 1/2006 | Auburger et al. |
| 2013/0214365 A1 | 8/2013 | Schlarmann et al. |

OTHER PUBLICATIONS

Schreier-Alt, et al., "Simulation and experimental analysis of large area substrate overmolding with epoxy molding compounds," Microelectronics Reliability, Elsevier Ltd., 2010, pp. 1-8.

*Primary Examiner* — Anthony Ho
(74) *Attorney, Agent, or Firm* — Blakely, Sokoloff, Taylor & Zafman LLP

(57) ABSTRACT

MEMS packages, modules, and methods of fabrication are described. In an embodiment, a MEMS package includes a MEMS die and an IC die mounted on a front side of a surface mount substrate, and a molding compound encapsulating the IC die and the MEMS die on the front side of the surface mount substrate. In an embodiment, a landing pad arrangement on a back side of the surface mount substrate forms and anchor plane area for bonding the surface mount substrate to a module substrate that is not directly beneath the MEMS die.

20 Claims, 4 Drawing Sheets

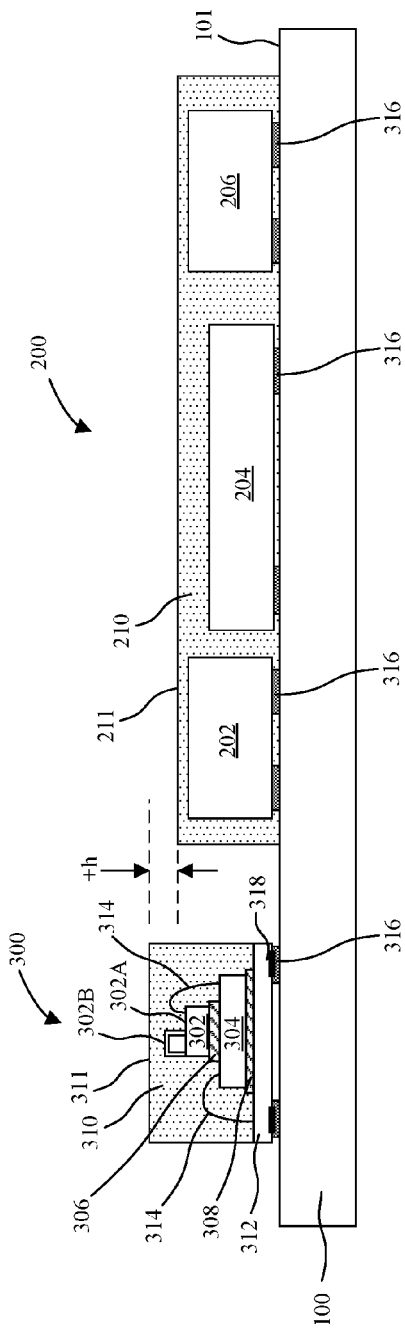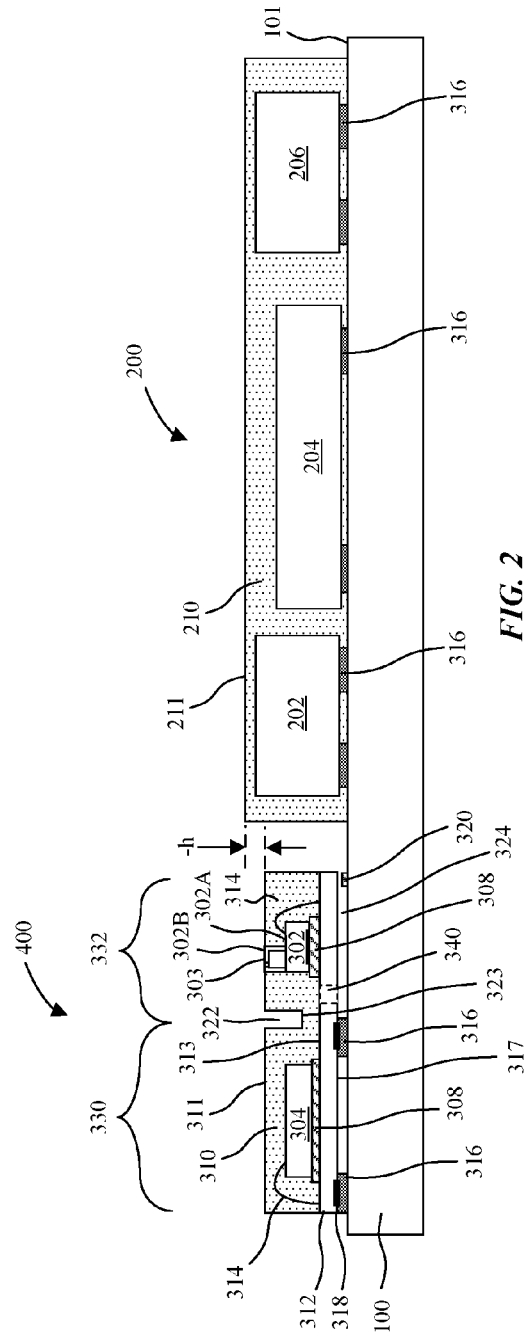

METHOD OF LOWER PROFILE MEMS PACKAGE WITH STRESS ISOLATIONS

RELATED APPLICATIONS

This application is a divisional of co-pending U.S. patent application Ser. No. 14/568,845 filed Dec. 12, 2014, which is incorporated herein by reference.

BACKGROUND

Field

Embodiments described herein relate to semiconductor packaging. More particularly embodiments relate to MEMS packages, modules, and methods of fabrication.

Background Information

As electronic products are becoming increasingly sophisticated and the size of the overall packages is reduced to meet market needs, these advances are associated with various packaging challenges to reduce cost and form factor of the packages. In addition as the market drives thinner package profiles, it becomes more difficult to manage strain induced performance drift.

Micro-electro-mechanical systems (MEMS) die can be formed from customized integrated circuits, and have become a significant growth area in consumer space. MEMS are often used to sense environmental characteristics or act as a user input for electronic products. However, MEMS devices such as gyroscopes, accelerometers, microphones, pressure sensors, environmental sensors and magnetometers are all sensitive to strain induced performance drift and can have unique packaging and mounting requirements compared to some general purpose integrated circuit (IC) die.

SUMMARY

MEMS packages, modules, and methods of formation are described. In an embodiment, a MEMS package includes an IC die mounted on a front side of a surface mount substrate, and a MEMS die mounted on the front side of the surface mount substrate laterally adjacent to the IC die. The MEMS die and IC die can be mounted on the surface mount substrate using a variety of methods, including a die attach film with wire bonding or flip chip bonding. A molding compound encapsulates the IC die and the MEMS die on the front side of the surface mount substrate. The molding compound may be formed directly on the surface mount substrate. The molding compound may be formed directly over the MEMS die, or alternatively may not cover a top surface of the MEMS die, for example, so that the MEMS die is exposed to ambient environment. In an embodiment, a landing pad arrangement, including all landing pads on a back side of the surface mount substrate, surrounds a periphery of the IC die on the front side of the surface mount substrate and does not surround a periphery of the MEMS die on the front side of the surface mount substrate. A plurality of conductive bumps (e.g. solder balls) may be placed on the landing pads, with each landing pad having corresponding conductive bump.

In an embodiment, a trench is in a top surface of the molding compound between the IC die and the MEMS die. In an embodiment, one or more openings are formed in the surface mount substrate between the IC die and the MEMS die. The size and shape of the trench and opening(s) may be used for isolating the MEMS die from package and module stress. In an embodiment, a bottom surface of the trench is below a top surface of the MEMS die.

In an embodiment, a module includes a module substrate, and the MEMS package bonded to the module substrate. In an embodiment, the arrangement of conductive bumps corresponds to an anchored area of the surface mount substrate directly over the module substrate. A hanging area of the surface mount substrate laterally extends from the anchored area of the surface mount substrate, and a conductive bump is not formed directly beneath the hanging area of the surface mount substrate. In such a configuration an air gap may exist directly between a back side of the surface mount substrate and the module substrate. Various configurations are described that may protect the hanging portion from flexing to the point that the conductive bumps fracture. For example, one or more bumpers may optionally be formed on the module substrate directly beneath the hanging area of the surface mount substrate. An air gap may exist directly between the back side of the surface mount substrate and the bumper(s). One or more bumpers may optionally be formed on a back side of the surface mount substrate directly beneath the hanging area of the surface mount substrate. An air gap may exist directly between the bumper(s) and the front side of the module substrate. Other structural features may be used to provide mechanical protection. For example, a metal trace, and or solder mask can be formed on either or both of the back side of the surface mount substrate and the front side of the module substrate directly beneath the hanging area. In an embodiment, the solder mask covers the metal trace. In this manner, height of the metal traces and/or solder mask layers can form protruding structures for protecting against excessive bending of the hanging area.

In an embodiment, a plurality of other components are bonded to the top side of the module substrate, and encapsulated in a second molding compound on the top side of the module substrate. For example, the plurality of other components and the second molding compound may correspond to a mold array package (MAP) configuration. In an embodiment, a top surface of the molding compound encapsulating the IC die and the MEMS die is below a top surface of the second molding compound encapsulating the plurality of other components.

BRIEF DESCRIPTION OF THE DRAWINGS

FIG. 1 is a cross-sectional side view illustration of a module including a MEMS package with a stacked die configuration.

FIG. 2 is a cross-sectional side view illustration of a module including a MEMS package a side-by-side die configuration in accordance with an embodiment.

DETAILED DESCRIPTION

Figure 3:
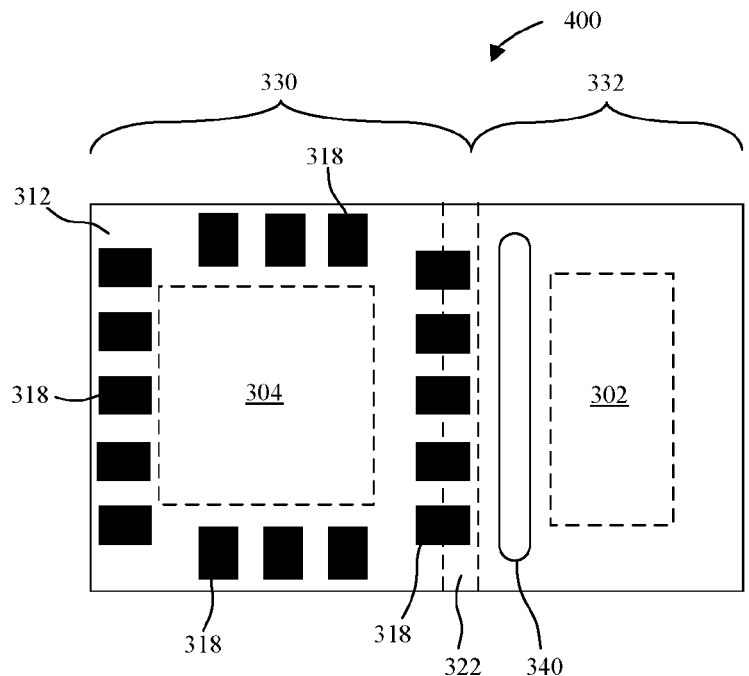
FIG. 3 is schematic back side view illustration of a MEMS package in accordance with an embodiment.

Embodiments describe MEMS packages, modules, and methods of fabrication. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between" and "on" as used herein may refer to a relative position of one layer with respect to other layers. One layer "above", "over" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe MEMS packages, modules, and manners of fabrication which may address MEMS package and module stress. It has been observed that MEMS devices are sensitive to stress. For example, stress transfer to a MEMS die from an underlying substrate (such as surface mount substrate and module substrate) can cause MEMS device/sensor output shift. In addition, stress impact to device/sensor output change may become more serious when MEMS package thickness and form factor are further reduced to meet market needs.

In another aspect, embodiments describe MEMS packages, modules, and manners of fabrication which may enable reduced MEMS package profile and overall module profile. In an embodiment, a MEMS die and integrated circuit (IC) die are mounted side-by-side on a surface mount substrate. In such an arrangement, MEMS die thickness may be maintained without sacrificing the strain sensitivity of the MEMS die. It has been observed that thicker MEMS die may be less sensitive to strain then thinner MEMS die. Thus, as consumer devices, particularly mobile and wearable devices, continue to become thinner with increased functionality, further reduction in MEMS die thickness may be met with a tradeoff of increased strain induced performance drift. A side-by-side configuration may also allow for a reduced MEMS package height and resulting module height, particularly where a MEMS die component thickness is a significant barrier to z-height profile reduction of the MEMS package and module. Thus, while a side-by-side configuration may possibly increase the footprint of a MEMS package, in accordance with some embodiments, MEMS die thickness can be maintained at a sufficient thickness for reduced susceptibility to strain.

In another aspect, embodiments describe a MEMS packages and modules with low profiles, low strain susceptibility, and low temperature coefficient of offset (TCO) for a contained MEMS device. The offset error of a device/sensor due to temperature is due to TCO. This parameter is the rate of change of the offset when the device/sensor is subject to temperature. Where TCO is high, the device/sensor may require offset calibration. Lower TCO may allow for higher resolution devices/sensors and less offset calibration. In accordance with embodiments, MEMS packages and modules are described that may include low profiles, and specific structures for stress management or isolation resulting in improved TCO and MEMS device or sensor operation.

In an embodiment, an air gap technique is described in order to alleviate the impact of stress transfer from underlying substrates to MEMS devices. In an embodiment, a MEMS die and IC die are mounted side-by-side on a surface mount substrate, which in turn is bonded to a module substrate such as a printed circuit board (PCB). In an embodiment, the surface mount substrate is anchored to the module substrate with an arrangement of conductive bumps such that a portion of the package substrate includes an anchored area directly over the PCB, and a hanging area. In an embodiment, the MEMS die is mounted on the surface mount substrate in the hanging area of the surface mount substrate. For example, the surface mount substrate may be bonded to a module substrate in a cantilever-type configuration. Additional features may be included for additional stress isolation, and reduced strain susceptibility of the MEMS die. In an embodiment a partial cut or trench is created in a top surface of a molding compound that encapsulates the side-by-side MEMS die and IC die, with the partial cut or trench located between the MEMS die and the IC die. In an embodiment, one or more slots or holes are formed in the surface mount substrate between the side-by-side MEMS die and IC die.

As used herein, "encapsulating" does not require all surfaces to be encased within a molding compound. For example, referring briefly to FIG. 5 the lateral sides of MEMS die 302 are encased in molding compound 310, while the molding compound is not formed over the top surface of the MEMS die 302. As will become apparent in the following description, the height of the molding compound 310 may contribute to the overall z-height of the MEMS package and module. Accordingly, in some embodiments, the amount of molding compound is controlled to achieve a specified height. In accordance with embodiments, MEMS devices such as pressure sensors, microphones, and environmental sensors for sensing temperature, humidity, and gas can have unique packaging and mounting requirements since the MEMS devices often require exposure to an ambient external environment, such as an ambient environment of a user using the electronic product having the MEMS device. In some embodiments, an amount of the molding compound 310 is controlled in order to expose the top surface of the MEMS die 302 so that it is exposed to ambient environment. However, it is not required that that the top surface of the MEMS die 302 is exposed in all embodiments, and the molding compound 310 may cover the top surface of the die 302. For example, it may not be required for MEMS devices such as accelerometers, magnetometers, and gyroscopes to be exposed to the ambient environment.

A variety of surface mount substrates can be used in accordance with embodiments, such as land grid array (LGA), ball grid array (BGA), quad flat no-leads QFN, or ceramic substrates. In an embodiment, flip chip bonding is used as the surface mount interconnection method for electrically connecting the surface mount substrate to the module substrate.

Referring now to FIG. 1, a cross-sectional side view illustration is provided of a module including a MEMS package 300 with a stacked die configuration. As illustrated the module includes a MEMS package 300 bonded to a module substrate 100 with conductive bumps 316. A plurality of additional components, illustrated as 202, 204, and 206 are also bonded to the module substrate and encapsulated within a molding compound 210 on the module substrate. For example, the module substrate 100 may be a printed circuit board (PCB), ceramic panel, leadframe, or wafer. The components 202, 204, 206 can be any combination of numerous passive or active components. The assembled components 202, 204, 206 may be arranged on the module substrate 100 in a mold array package (MAP) configuration in which each of the components 202, 204, 206 is encapsulated within a single molding compound 210 on a top side 101 of the module substrate 100. Together, the components 202, 204, 206 and molding compound 210 may be considered as a MAP 200. The molding compound 210 may cover a top surface of each of the components 202, 204, 206.

As illustrated in FIG. 1, a MEMS package 300 is bonded to a top side 101 of the module substrate 100 outside the area reserved for the MAP 200. For example, this may aid in stress isolation and operation of the MEMS die 302. The particular MEMS package 300 illustrated in FIG. 1 includes a stacked-die arrangement in which a MEMS die 302 is stacked onto an IC die 304. As shown, the MEMS die 302 includes a base substrate 302A and a cap 302B. The particular arrangement is meant to be exemplary, and non-limiting. The exemplary MEMS package 300 includes a surface mount substrate 312, an IC die 304, such as an application specific integrated circuit (ASIC) die, attached to the surface mount substrate 312 with a die attach film 308, and a MEMS die 302 attached to the IC die 304 with a die attach film 306. Wire bonds 314 are used to provide electrical connection between the MEMS die 302, IC die 304, and surface mount substrate 312. A molding compound 310 of a molding compound encapsulates the die and wire bonds on the surface mount substrate 312.

In the particular configuration illustrated in FIG. 1, the profile height of the MEMS package 300 is illustrated as being greater than a profile height of the MAP 200 on the same side of the module substrate 100. The height difference (+h) between the top surface 311 of the MEMS package 300 and the top surface 211 of the MAP 200 may be attributed to the thickness of the MEMS die 302 or die stacking within the MEMS package 300. It has been observed that thicker MEMS die 302 may be less sensitive to strain than thinner MEMS die. Thus, as consumer devices, particularly mobile and wearable devices, continue to become thinner with increased functionality, further reduction in MEMS die 302 and MEMS package 300 thickness may be met with a tradeoff of increased strain induced performance drift.

Figure 4A:
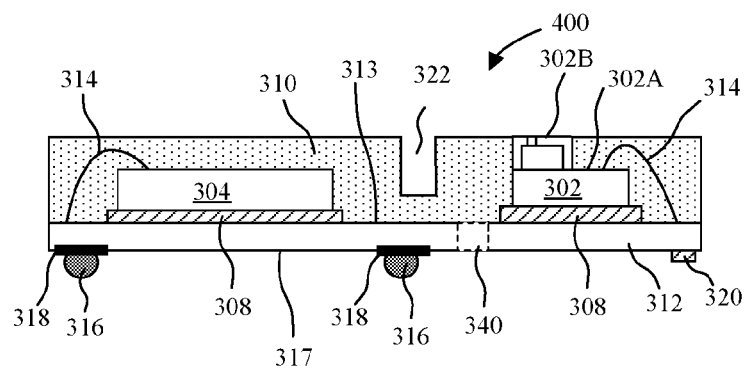
FIG. 4A is a cross-sectional side view illustration of a MEMS package in accordance with an embodiment.
Figure 4B:
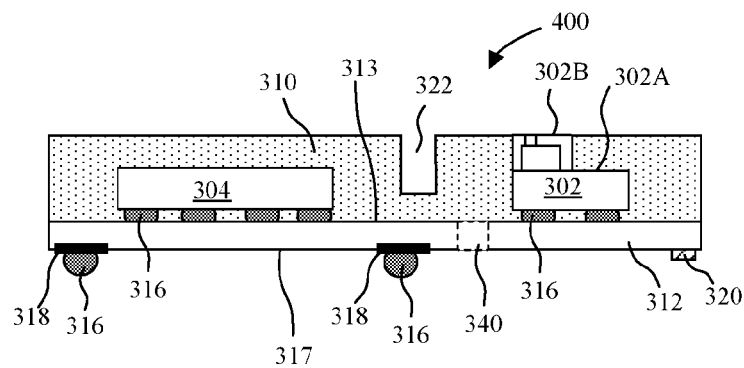
FIG. 4B is a cross-sectional side view illustration of a MEMS package in accordance with an embodiment.

Referring now to FIG. 2, in accordance with embodiments a MEMS package 400 is illustrated including a MEMS die 302 and IC die 304 mounted on a front side of a surface mount substrate 312 in a side-by-side configuration. In the embodiment illustrated in FIG. 2, MEMS die 302 thickness may be maintained at a sufficient thickness for reduced susceptibility to strain. In the embodiment illustrated, surface mount substrate 312 is bonded to the module substrate 100 with an arrangement of conductive bumps 316 including all of the conductive bumps bonding the surface mount substrate 312 to the module substrate 100. The arrangement of conductive bumps 316 corresponds to an anchored area 330 of the surface mount substrate directly over the module substrate. The surface mount substrate 312 additionally includes a hanging area 332 that laterally extends from the anchored area 330 in which a conductive bump 316 is not formed directly underneath the hanging area 332 of the surface mount substrate 312. Still referring to FIG. 2, the IC die 304 (e.g. ASIC die) is mounted on the front side 313 of the surface mount substrate 312 in the anchored area 330 of the surface mount substrate, and the MEMS die 302 is mounted on the front side 313 of the surface mount substrate 312 in the hanging area 332 of the surface mount substrate 312. In the exemplary MEMS package 400, the IC die 304 is mounted on the surface mount substrate with a die attach film 308, and the MEMS die 302 is mounted on the surface mount substrate with a die attach film 306. Wire bonds 314 are used to provide electrical connection between the MEMS die 302, IC die 304, and surface mount substrate 312 in the illustrated embodiment. Wire bonds 314 can also be used for die-to-die interconnection between MEMS die 302 and IC die 304. In another embodiment, the IC die 304 and/or the MEMS die 302 may be mounted on the surface mount substrate, for example as a flip chip attachment with no wire bonds. Such a configuration is illustrated in FIG. 4B. A variety of alternative attachment method may be used for mounting the MEMS die and IC die on the surface mount substrate. In accordance with embodiments, molding compound 310 (e.g. epoxy) encapsulates the IC die 304 and the MEMS die 302 on the front side 313 of the surface mount substrate 312. The molding compound 310 may be formed directly on the front side 313 of the surface mount substrate. In the particular embodiment illustrated, the molding compound 310 does not cover the top surface of the MEMS die 302, and is illustrated as being flush with the top surface of the MEMS die 302. For example, this may allow the MEMS die 302 to be exposed to the ambient atmosphere. The molding compound 310 may alternatively cover the top surface of the MEMS die 302.

As shown in FIG. 2, the profile height of the MEMS package 400 is illustrated as being less than a profile height of the MAP 200 on the same side of the module substrate 100. The height difference (−h) between the top surface 311 of the MEMS package 400 and the top surface 211 of the MAP 200 may be attributed to the side-by-side arrangement of MEMS die 302 and IC die 304. The side-by-side arrangement, may additionally allow for a thicker MEMS die 302, which may be less sensitive to strain than thinner MEMS die. For example, the MEMS die 302 illustrated in FIG. 2 could be made thicker for improved performance, with a total thickness increase equivalent to (-h) without affecting the overall module thickness. In an embodiment, the profile height of the MEMS package 400 on the module substrate 100 is approximately the same as the profile height of the MAP 200 on the same side of the module substrate 100.

In an embodiment, the surface mount substrate 312 is bonded to the module substrate 100 in a cantilever-type configuration, in which the anchored area 330 corresponds to a fixed end of the cantilever and the hanging area 332 corresponds includes a free end opposite the fixed end. In an embodiment, an air gap 324 exists between the back side 317 of the surface mount substrate 312 and the module substrate 100. In an embodiment, one or more bumpers 320 are formed on the module substrate 100 directly beneath the hanging area 332 of the surface mount substrate to protect the bonded area between the surface mount substrate and module substrate (corresponding to the conductive bumps 316) from breaking. Alternatively, or in addition to, one or more bumpers 320 may be formed on the back side 317 of the surface mount substrate 312 in the hanging area 332 to protect the bonded area between the surface mount substrate and module substrate from breaking. For example, the one or more bumpers 320 may aid in drop and shock resistance of the bonded MEMS package 400. In an embodiment, the one or more bumpers 320 are formed of an elastomeric material. In an embodiment, the air gap 324 is also directly between the one or more bumpers 320 and either the surface mount substrate or module substrate, depending on location of the one or more bumpers. Additional structures for providing mechanical protection to the bonded area are described below with regard to FIG. 5 in accordance with embodiments.

Still referring to FIG. 2, in an embodiment a trench 322 is located in the top surface 311 of the molding compound 310 (which also corresponds to the top surface of the MEMS package 400 in FIG. 2) between the IC die 304 and the MEMS die 302. The trench 322 may be formed during the molding process. Trench 322 may also be formed after the molding process, for example by using a mechanical blade or laser. In an embodiment, the depth, length, and width of the trench is designed to achieve mechanical integrity for handling and stress isolation. For example, the trench may isolate the MEMS die 302 from induced stress transfer from the underlying substrates (surface mount substrate and/or module substrate) including mechanical stress, thermal mechanical stress, and hygroscopic stress. For example, the trench may isolate stress transfer from mechanical stress in the surface mount substrate and/or module substrate (e.g. from screws in the module substrate), thermal mechanical stress (e.g. associated with a higher coefficient of thermal expansion (CTE) of the module substrate), or hygroscopic stress (e.g. associated with moisture absorption by the module substrate). In an embodiment, a bottom surface 323 of the trench 322 is below a top surface 303 of the MEMS die 302.

In an embodiment, one or more openings 340 are optionally formed in the surface mount substrate 312 between the IC die 304 and the MEMS die 302. In an embodiment, the one or more openings 340 extend entirely through the surface mount substrate 312. Openings 340 may be in the form of slots or holes, for example. In an embodiment, the size of the openings 340 isolate the MEMS die 302 from induced stress transfer from the surface mount substrate and/or module substrate including mechanical stress, thermal mechanical stress, and hygroscopic stress.

Referring now to FIG. 3 a schematic back side view illustration is provided of a MEMS package 400 in accordance with an embodiment. In the particular illustration provided in FIG. 3, only certain features are included in order to illustrate the relationship of specific features. FIGS. 4A-4B are cross-sectional side view illustrations of MEMS packages 400 in accordance with embodiments. For example, in FIG. 4A the IC die 304 and MEMS die 302 are illustrated as being bonded to the surface mount substrate 312 with die attach films 308. In FIG. 4B the IC die 304 and MEMS die 302 are illustrated as being flip chip bonded to the surface mount substrate 312 with conductive bumps 316. In accordance with embodiments, a number of combinations of bonding methods may be used for bonding the IC die and MEMS die to the surface mount substrate, and it is not required for the same bonding method to be used for both the IC die and MEMS die. In the following description, features in any or all FIGS. 3-4B are discussed concurrently. As shown in FIGS. 3-4B, an arrangement of landing pads 318 is on a back side 317 of the surface mount substrate 312. Conductive bumps 316 (e.g. solder balls) may optionally be placed on landing pads 318 for bonding to a module substrate. In an embodiment, the landing pad 318 arrangement surrounds a periphery of the IC die 304 on the front side 313 of the surface mount surface and does not surround a periphery of the MEMS die 302 on the front side of the surface mount substrate. In an embodiment, the landing pad 318 arrangement does not overlap the periphery of the MEMS die 302. The peripheries of the IC die 304 and MEMS die 302 are illustrated as dotted lines in FIG. 3. As illustrated, the landing pads 318 are offset such that they are located only underneath a proximity of the IC die area, rather than underneath the MEMS die area.

As described above, the dimensions of the trench 322 and/or opening 340 may be designed to achieve mechanical integrity for handling and isolation of the MEMS die 302 from induced stress transfer. In an embodiment, at least one x-y dimension of the trench 322 is smaller than an x-y dimension of the molding compound 310. In the embodiment illustrated in FIG. 3 the trench 322 is formed entirely across the width of the molding compound 310 between the IC die 304 and MEMS die 302. Location and dimensions of the trench 322 may be adjusted so that wires 314 are not exposed, if present. In the embodiment illustrated, a width of the slot shaped opening 340 is greater than a width of the MEMS die 302 in the same direction. Width and length, and potentially depth, of the one or more openings 340 may be adjusted to accommodate routing within the surface mount substrate 312. In an embodiment, a plurality of openings 340 are formed through the surface mount substrate between the IC die 304 and MEMS die 302. In an embodiment, the openings 340 are located in an area of the outside of the landing pad 318 arrangement in the hanging area 332 of the surface mount substrate.

Figure 5:
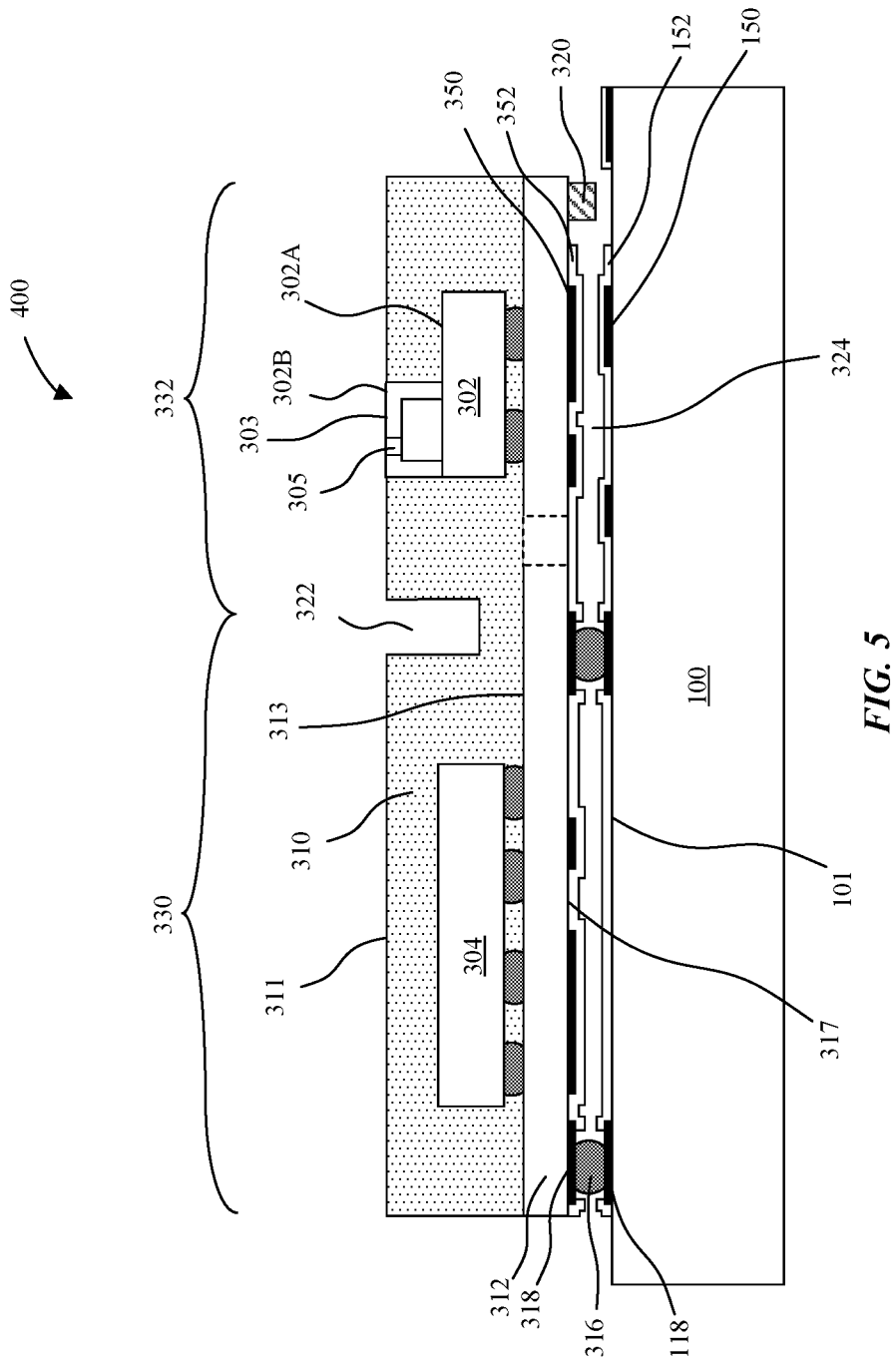
FIG. 5 is a close up cross-sectional side view illustration of a MEMS package bonded to a module substrate in accordance with an embodiment.

FIG. 5 is a close up cross-sectional side view illustration of a MEMS package bonded to a module substrate in accordance with an embodiment. As described above, it is not required for the molding compound 310 to cover the top surface of the MEMS die 302. For example, as shown in FIG. 5 a vent hole 305 in the top surface of the cap 302B is exposed to allow exposure of the MEMS device within the IC die to ambient atmosphere.

As described above, various structures may be included to provide mechanical protection to the bonded area corresponding to conductive bumps 316 that bonded to the landing pads 118, 318 on the module substrate 100 and surface mount substrate 312. In an embodiment, one or more bumpers 320 are formed on the back side 317 of the surface mount substrate 312 and/or top side 101 of the module substrate 100. In an embodiment, a metal trace 118, 318 (e.g., Cu) and/or solder mask 152, 352 can be formed on either or both of the back side of the surface mount substrate and the front side of the module substrate directly beneath the hanging area. Solder masks 152, 352 may be formed of any suitable material such as, but not limited to, epoxy or polyimide. In an embodiment, an exemplary standoff height for conductive bumps 316 may be approximately 20-50 μm. In an embodiment, metal traces 118, 318 may be approximately 5-15 μm thick. Thus, by tailoring the thickness of the conductive bumps 316, metals traces, and/or solder masks 152, 352 and appropriate air gap 324 thickness can be provided directly underneath the hanging area 332 for protecting against excessive bending of the hanging area. Height of optional bumpers 320 can similarly be determined. In an embodiment, a bumper 320 is formed directly over a solder mask 152, 352, and may be formed directly on a solder mask.

Figure 6:
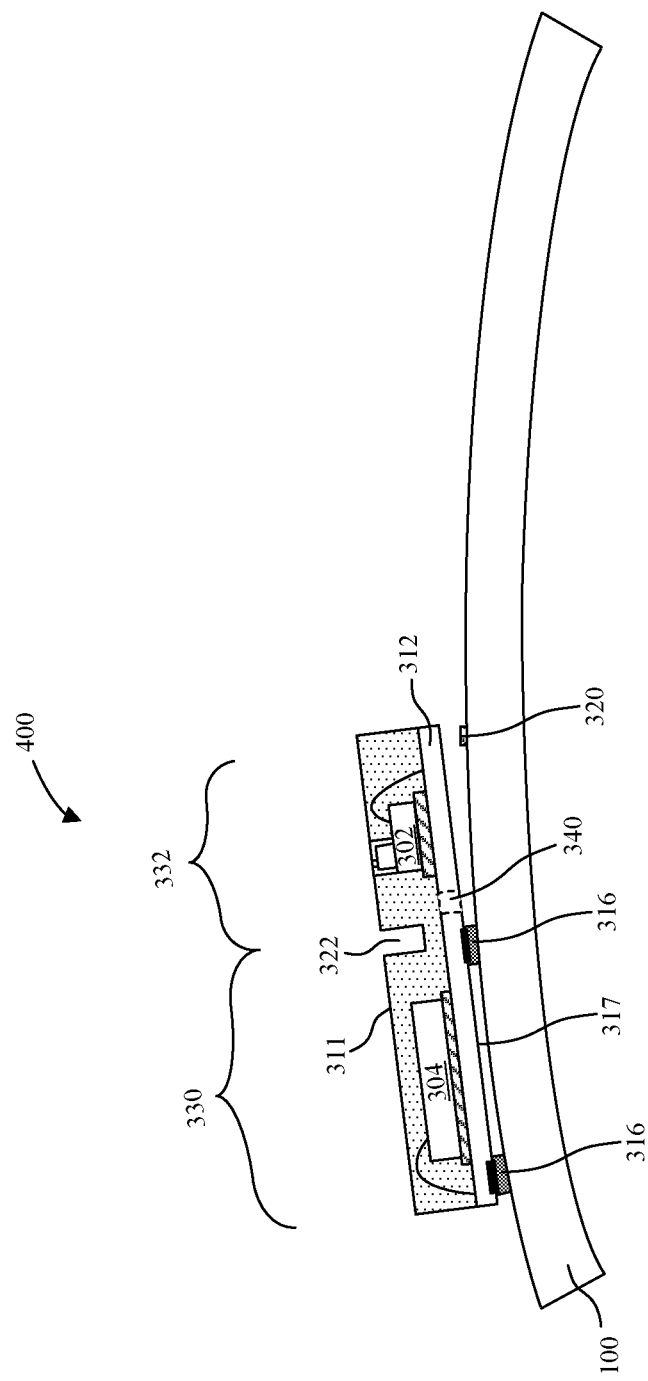
FIG. 6 is a cross-sectional side view illustration of a strained MEMS module in accordance with an embodiment.

Referring now to FIG. 6, a cross-sectional side view illustration is provided of a strained MEMS module in accordance with an embodiment. For example, the module substrate 100 may be warped due to thermal expansion or hygroscopic stress. In the particular embodiment illustrated, the module substrate 100 has a "cry" shape. In such a configuration, the bottom surface of the module substrate may be under compressive strain with the top surface onto which the MEMS package 400 is bonded under tensile strain. The particular strain relationship illustrated in FIG. 6 is exaggerated to illustrate immunity to bending strain that may be achieved in accordance with embodiments. As shown, as the module substrate 100 is bent, stress is transferred directly into the anchored area 330. The transferred stress may also result in strain in the anchored area 330 of the surface mount substrate 312, and potentially bending of the surface mount substrate in the anchored area 330. This stress is transferred to components mounted in this region of the surface mount substrate. In accordance with embodiments, since the hanging area 332 is not directly attached to the module substrate 100 less strain is transferred to the hanging area 332, and consequently to any components mounted in the hanging area. Thus, the hanging area may exhibit less bending, and stress transfer to the MEMS die 302.

In the embodiment illustrated in FIG. 6, the back side 317 of the surface mount substrate 312 in the anchored area 330 may be under compressive stress caused by the module substrate 100. Similarly, the top surface 311 of the molding compound may be under tensile stress. In accordance with embodiments, the trench 322 may reduce the transfer of tensile stress across the hanging area 332. Similarly, the one or more openings 340 may reduce the transfer of stress (e.g. compressive) from the surface mount substrate 312 across the hanging area 332. Thus, in accordance with embodiments the hanging area 332, trench 322, and opening 340 may isolate the MEMS die 302 from mechanical stress.

In utilizing the various aspects of the embodiments, it would become apparent to one skilled in the art that combinations or variations of the above embodiments are possible for forming a MEMS package and module. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
    a surface mount substrate;
    an integrated circuit (IC) die mounted on a front side of the surface mount substrate;
    a micro-electrical-mechanical systems (MEMS) die mounted on the front side of the surface mount substrate laterally adjacent to the IC die;
    a molding compound that encapsulates the IC die and the MEMS die on the front side of the surface mount substrate; and
    a landing pad arrangement including all landing pads on a back side of the surface mount substrate, wherein the landing pad arrangement surrounds a periphery of the IC die on the front side of the surface mount substrate and does not surround a periphery of the MEMS die on the front side of the surface mount substrate.

2. The package of claim 1, further comprising a trench in a top surface of the molding compound between the IC die and the MEMS die.

3. The package of claim 2, wherein a width of the trench is greater than a width of the MEMS die in a same direction.

4. The package of claim 3, wherein the trench is formed entirely across a width of the molding compound.

5. The package of claim 2, wherein a bottom surface of the trench is below a top surface of the MEMS die.

6. The package of claim 1, further comprising a plurality of conductive pumps, with each landing pad having a corresponding conductive bump.

7. The package of claim 1, wherein the molding compound that encapsulates the IC die and the MEMS die does not cover a top surface of the MEMS die.

8. The package of claim 1, further comprising a metal trace on the back side of the surface mount substrate directly beneath the MEMS die, and a solder mask directly on the metal trace directly beneath the MEMS die.

9. The package of claim 1, wherein the molding compound is formed directly on the surface mount substrate.

10. The package of claim 1, further comprising an opening in the surface mount substrate between the IC die and the MEMS die.

11. The package of claim 10, wherein the opening has a width that is greater than a width of the MEMS die in a same direction.

12. The package of claim 1, further comprising a plurality of openings in the surface mount substrate between the IC die and the MEMS die.

13. The package of claim 1, further comprising a bumper on the back side of the surface mount substrate, the bumper formed of an elastomeric material.

14. The package of claim 1, wherein the MEMS die is attached to the surface mount substrate with a die attach film.

15. The package of claim 14, wherein the MEMS die is wire bonded to the surface mount substrate.

16. The package of claim 1, further comprising:
    a trench in a top surface of the molding compound between the IC die and the MEMS die; and
    an opening in the surface mount substrate between the IC die and the MEMS die.

17. The package of claim 1, further comprising a trench in a top surface of the molding compound between the IC die and the MEMS die, wherein the MEMS die is attached to the surface mount substrate with a die attach film.

18. The package of claim 17, wherein the trench is slot shaped.

19. The package of claim 17, further comprising a bumper on the back side of the surface mount substrate, the bumper formed of an elastomeric material.

20. The package of claim 19, further comprising an opening in the surface mount substrate between the IC die and the MEMS die.

* * * * *